US010958060B2

(12) United States Patent
Chaintreuil et al.

(10) Patent No.: US 10,958,060 B2
(45) Date of Patent: Mar. 23, 2021

(54) METHOD AND DEVICE FOR DETECTING AN ELECTRIC ARC IN A PHOTOVOLTAIC INSTALLATION (71) Applicants: COMMISSARIAT A L'ENERGIE ATOMIQUE ET AUX ENERGIES ALTERNATIVES, Paris (FR); SOCOMEC, Benfeld (FR)

(72) Inventors: Nicolas Chaintreuil, Montmelian (FR); Stéphane Siat, Obenheim (FR); Christian Kern, Sigolsheim (FR)

(73) Assignees: COMMISSARIAT A L'ENERGIE ATOMIQUE ET AUX ENERGIES ALTERNATIVES, Paris (FR); SOCOMEC, Benfeld (FR)

( * ) Notice: Subject to any disclaimer, the term of this patent is extended or adjusted under 35 U.S.C. 154(b) by 272 days.

(21) Appl. No.: 15/780,113

(22) PCT Filed: Dec. 1, 2016

(86) PCT No.: PCT/EP2016/079466
§ 371 (c)(1),
(2) Date: May 30, 2018

(87) PCT Pub. No.: WO2017/093420
PCT Pub. Date: Jun. 8, 2017

(65) Prior Publication Data
US 2018/0358797 A1    Dec. 13, 2018

(30) Foreign Application Priority Data

Dec. 1, 2015  (FR) ...................................... 1561622

(51) Int. Cl.
*H02H 1/00*    (2006.01)
*H02S 50/10*   (2014.01)
(Continued)

(52) U.S. Cl.
CPC ..... *H02H 1/0015* (2013.01); *G01R 19/16528* (2013.01); *H02H 1/0092* (2013.01);
(Continued)

(58) Field of Classification Search
CPC ...... H02H 1/00; H02H 1/0007; H02H 1/0015; H02H 1/0023; H02H 1/0092; H02H 7/20;
(Continued)

(56) References Cited

U.S. PATENT DOCUMENTS

2012/0134058 A1    5/2012  Pamer et al.
2012/0318320 A1*  12/2012  Robbins ............... H02H 1/0015
                                              136/244
(Continued)

FOREIGN PATENT DOCUMENTS

CN          104092440 A      10/2014

OTHER PUBLICATIONS

International Search Report and Written Opinion dated Jan. 17, 2017 issued in corresponding application No. PCT/EP2016/079466; w/ English partial translation and partial machine translation (17 pages).

*Primary Examiner* — Thienvu V Tran
*Assistant Examiner* — Ivan Laboy
(74) *Attorney, Agent, or Firm* — Westerman, Hattori, Daniels & Adrian, LLP (57) ABSTRACT

The photovoltaic installation being intended to supply an electric current (i), the method comprises the steps of measuring (e0) values representative of the electric current (i) supplied by the photovoltaic installation; adjusting (e2) a variable current jump threshold (s(ti)) according to measured values; detecting (e3) a current jump with an amplitude greater than a current jump threshold adjusted according to values measured before the jump; and detecting (e5) an electric arc based on the detection of a current jump.

18 Claims, 6 Drawing Sheets

2 - inverter
3 - electrical grid
5 - detection device
6 - measurement module
7 - shunt resistor
8 - sensor
10 - processing unit
12 - intervention device (51) Int. Cl.
   *G01R 19/165*   (2006.01)
   *H02S 50/00*    (2014.01)
   *H02H 7/20*     (2006.01)

(52) U.S. Cl.
   CPC .............. *H02S 50/00* (2013.01); *H02S 50/10* (2014.12); *H02H 7/20* (2013.01)

(58) Field of Classification Search
   CPC   H02H 7/26; H02S 50/00; H02S 50/10; H02S 50/15; H01L 31/02008; H01L 31/02021; G01R 19/16528; G01R 31/40
   See application file for complete search history.

(56)           References Cited

U.S. PATENT DOCUMENTS

| | | | |
|---|---|---|---|
| 2014/0095086 | A1* | 4/2014 | Parker ................ G01R 31/1272 |
| | | | 702/58 |
| 2014/0168843 | A1* | 6/2014 | Privitera ................ G01R 31/50 |
| | | | 361/93.1 |
| 2014/0301008 | A1* | 10/2014 | Gouy-Pailler .... H01L 31/02021 |
| | | | 361/93.2 |
| 2014/0373894 | A1 | 12/2014 | Stratakos et al. |
| 2016/0003883 | A1* | 1/2016 | Chaintreuil ............. H02S 50/10 |
| | | | 361/42 |
| 2016/0020729 | A1 | 1/2016 | Yu et al. |
| 2018/0097354 | A1* | 4/2018 | Yoscovich ............. H02S 50/00 |
| 2018/0233901 | A1* | 8/2018 | Ashida ................... H02S 50/00 |

* cited by examiner

2 - inverter
3 - electrical grid
5 - detection device
6 - measurement module
7 - shunt resistor
8 - sensor
10 - processing unit
12 - intervention device

20 - analogue to digital converter
21 - storage memory
22 - module for adjusting a variable current threshold
23 - module for detecting current jump
24 - module for detecting variation in noise level
25 - control module
26 - computing unit

Figure 6

METHOD AND DEVICE FOR DETECTING AN ELECTRIC ARC IN A PHOTOVOLTAIC INSTALLATION

TECHNICAL FIELD OF THE INVENTION

The invention relates to a method and a device for detecting an electric arc in a photovoltaic installation. It also relates to a photovoltaic installation equipped with such a device.

PRIOR ART

Photovoltaic installations operate with DC electric current and voltage, which is problematic in the event of the appearance of an electric arc. Such an electric arc may appear for example due to a connector fault, following the opening of a live connector or else following damage to a connector through corrosion. With DC current and voltage, there is no natural quenching of the electric arc through a zero-crossing of the voltage and of the current, as is generally the case with AC current. The electric arc generates a plasma that releases a very large amount of heat for a significant duration. Such a plasma is destructive and often starts fires. For safety reasons, it is therefore important to detect the presence of a possible electric arc within a photovoltaic installation and to interrupt it in order to prevent any damage or a fire.

An electric arc corresponds to a plasma that appears between two electrodes formed for example by two ends of a conductor that is open or locally interrupted due to damage. The appearance of an electric arc is accompanied by a positive or negative voltage jump or edge of short duration, of the order of a few microseconds, and that has a voltage value, called arc voltage Varc, that is characteristic. This arc voltage depends on the material of the electrodes. It is generally between 10 V and 30 V. If the electrodes are made of copper for example, the arc voltage Varc is of the order of 12 V. The result of this is that a sharp increase, of between 10 V and 30 V, in a voltage measured within a photovoltaic installation is therefore characteristic of the appearance of an electric arc in the installation. With the plasma of the electric arc performing the role of a resistance that increases over time, the initial voltage edge is followed by a gradual increase in the measured voltage until it reaches an open circuit voltage.

One known solution for detecting an electric arc in a photovoltaic installation is based on the detection of a positive (or negative) voltage edge characterized by a sharp voltage increase (or decrease) of a duration of a few microseconds and with a value corresponding to the arc voltage Varc, typically between 10 V and 30 V. To this end, the voltage across the terminals of a photovoltaic module of the installation is measured, for example. The voltage measurement across the terminals of the photovoltaic module makes it possible to detect a possible electric arc located outside of this photovoltaic module. However, it does not make it possible to detect an electric arc that may occur within the photovoltaic module itself. In the case of an installation including a plurality of photovoltaic modules, it is therefore necessary to measure the voltage across the terminals of a plurality of modules in order to cover the entire installation. Such a solution requires a plurality of measurement sensors, and therefore proves expensive.

Another known solution for detecting an electric arc in a photovoltaic installation is based on the measurement of the current in the photovoltaic installation and of the white noise introduced into the current signal by the electric arc. Such a solution requires only one current sensor that may be installed at any location in the photovoltaic installation, for example at the input of an inverter interposed between the photovoltaic installation and the electrical grid and intended to convert the DC current that is delivered into an AC current. Such a solution is less expensive and more flexible, but lacks reliability.

The invention aims to improve the situation.

SUBJECT OF THE INVENTION

To this end, the invention relates to a method for detecting an electric arc in a photovoltaic installation intended to deliver an electric current, characterized in that it comprises the following steps:
  Measuring values that are representative of the electric current delivered by the photovoltaic installation;
  Adjusting a variable current jump threshold as a function of measured values;
  Detecting a current jump having a magnitude greater than a current jump threshold adjusted as a function of values measured before the jump;
  Detecting an electric arc upon detection of a current jump.

The method of the invention for detecting an electric arc is based on a measurement of the electric current produced by the photovoltaic installation, or of an electrical value that is representative or an image of this electric current. By virtue of this, just one measurement sensor is necessary for monitoring the entire photovoltaic installation. Adjusting the current jump threshold as a function of the current produced by the installation makes it possible to take account of the fluctuations in magnitude of the current jumps caused by electric arcs, which may be due to variations in the level of illuminance of the photovoltaic installation and/or to a shift of an operating point of a photovoltaic module of the installation with respect to its maximum power point. The result of this is that the method of the invention is simple, inexpensive to implement and robust.

In one particular embodiment, the adjustment of the variable current jump threshold uses a law of variation of the threshold as a function of a nominal current of the photovoltaic installation, including a phase of increasing the current jump threshold as a function of said nominal current. In this case, the phase of increasing the threshold may be linear.

Advantageously, the law of variation of the threshold includes a constant current jump threshold phase for nominal current values of the photovoltaic installation that are less than a lower limit of between 0 A and 8 A, advantageously between 0.8 A and 1.2 A, in particular equal to 1 A.

Again advantageously, the law of variation of the threshold includes a constant current jump threshold phase for values of current delivered by the photovoltaic installation that are greater than an upper limit.

In one particular embodiment, to detect the current jump, the current jump threshold is adjusted as a function of an average current calculated over a temporal window of a duration between 50 µs and 500 ms preceding the current jump.

Advantageously, with the measured values that are representative of the current delivered by the photovoltaic installation being sampled, to detect a current jump, a set of 2N successive samples is recorded, N constituting a given detection depth, and a jump detection algorithm is executed, consisting in calculating the difference between the sum of the N oldest samples and the sum of the N most recent samples, and in checking whether the calculated difference is greater, in absolute value, than an adjusted current jump threshold.

Again advantageously, the jump detection algorithm is executed for two different detection depths N and M, and an electric arc is detected only if it is determined that the differences calculated for the two depths are greater, in absolute value, than the corresponding thresholds. By virtue of this, low-frequency phenomena and high-frequency phenomena that cause the current to vary are filtered out.

The size N may be tailored so as to filter out dynamic variations in the current of the photovoltaic installation, which variations are characterized by a characteristic frequency belonging to a frequency band between 1 Hz and 1000 Hz.

The size M may be tailored so as to filter out dynamic variations in the current of the photovoltaic installation, which variations are characterized by a characteristic frequency belonging to a frequency band between 100 kHz and 1000 kHz.

In one particular embodiment, the method comprises a step of detecting a variation in the noise level of a signal of the measured values that is greater than a critical variation.

The detection of a variation in the noise level makes it possible to supplement the detection of a current jump in order to look for the presence of an electric arc in the installation. It makes it possible in particular to detect certain electric arcs that do not cause a detectable current jump. By virtue of this, the electric arc detection is even more robust and reliable.

Advantageously, with the measured values being sampled, in the step of detecting a variation in the noise level, the variance of sampled measured values over a window of samples that slides over time is calculated.

Again advantageously, the step of detecting a variation in the noise level is executed several times on the same samples while modifying parameters so as to detect various types of specific electric arcs.

The invention also relates to a device for detecting an electric arc in a photovoltaic installation intended to deliver an electric current, characterized in that it comprises the following modules:
 a module for measuring values that are representative of the electric current delivered by the photovoltaic installation;
 a module for adjusting a variable current jump threshold as a function of measured values;
 a module for detecting a current jump having a magnitude greater than a current jump threshold adjusted as a function of values measured before the jump.

Advantageously, the device comprises an analog-to-digital converter intended to sample the measured values that are representative of the current delivered by the photovoltaic installation, means for storing sampled measured values intended to store a set of 2N successive samples, N constituting a given detection depth, and the module for detecting a current jump is designed to execute a jump detection algorithm, consisting in calculating the difference between the sum of the N oldest samples and the sum of the N most recent samples, and in checking whether the calculated difference is greater, in absolute value, than an adjusted current jump threshold.

Again advantageously, the device comprises a module for detecting a variation in the noise level of a signal formed by the measured values that is greater than a critical variation.

The invention also relates to a safety system for a photovoltaic installation, characterized in that it comprises a device for detecting an electric arc such as defined above and an intervention device intended to protect the photovoltaic installation in the event of an electric arc.

The invention also relates to a photovoltaic installation, characterized in that it comprises an electric arc detection device such as defined above or a safety system such as defined above.

BRIEF DESCRIPTION OF THE DRAWINGS

The invention will be better understood with the aid of the following description of a particular embodiment of the method of the invention for detecting an electric arc in a photovoltaic installation and of a particular form of implementation of a corresponding detection device, with reference to the appended drawings, in which.

DETAILED DESCRIPTION OF PARTICULAR EMBODIMENTS OF THE INVENTION

Figure 1:
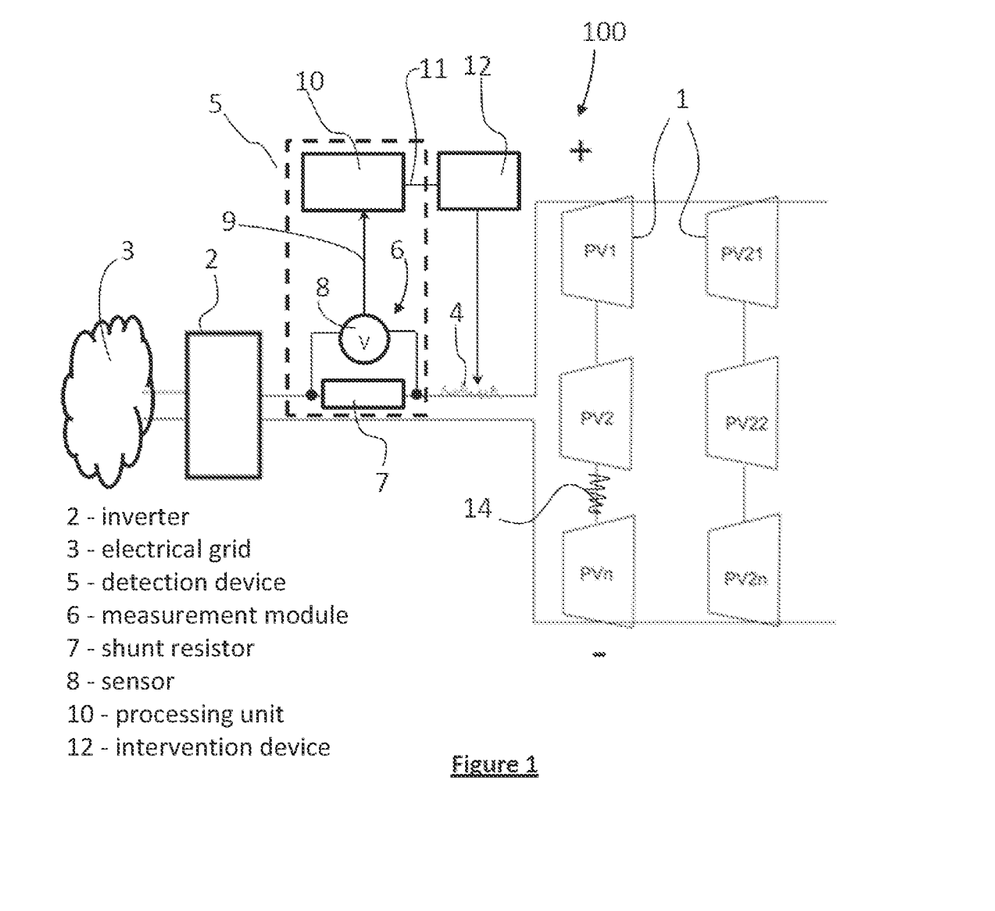
FIG. 1 shows a diagram of an example of a photovoltaic installation incorporating the detection device of FIG. 6.

The invention aims to detect the presence of an electric arc within the photovoltaic installation 100. It is based on measuring the electric current I supplied by the photovoltaic installation 100 or an electrical value that is representative, or the image, of this electric current I. FIG. 1 schematically shows an example of a photovoltaic installation 100. Said installation comprises, in a known manner, a plurality of photovoltaic (PV) modules 1 linked to an inverter 2. The PV modules 1 are identical in this case. The inverter 2 is intended to convert the DC current I produced by the photovoltaic modules 1 into an AC current, and to supply this to an electrical grid 3.

The method of the invention looks to detect the presence, or lack thereof, of an electric arc within a photovoltaic installation 100. Such an electric arc may occur at any location in the installation 100, for example between the photovoltaic modules 1 and the inverter 2 (as shown by the electric arc 4 in FIG. 1), or within a photovoltaic module 1, or else on a link linking a plurality of photovoltaic modules 1 in series (as shown by the electric arc 14 in FIG. 1).

An electric arc causes a significant variation in the voltage within the electrical installation 100. First of all, the appearance of the electric arc is accompanied by a positive or negative voltage jump or edge, of a duration of the order of a few microseconds and with a magnitude equal to a characteristic arc voltage $V_{arc}$. The value of this arc voltage $V_{arc}$ is typically between 10 V and 30 V. It depends on the material of the electrodes between which the electric arc forms.

Figure 3:
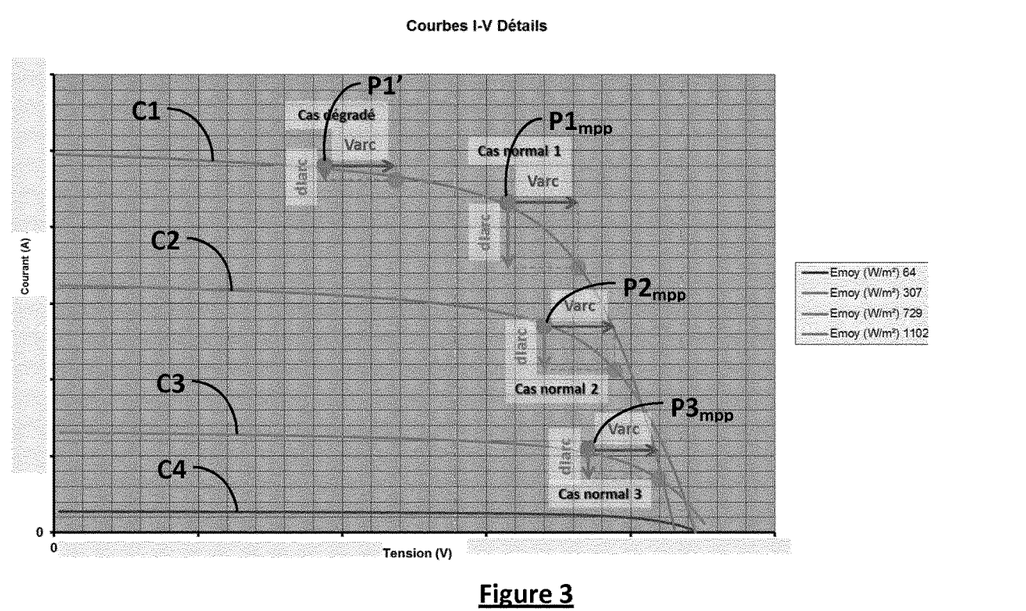
FIG. 3 shows various characteristic current-voltage curves of a photovoltaic installation, subjected to various irradiances (or illumination powers)

A photovoltaic module has its own specific current-voltage characteristic. Said characteristic may be represented in the form of a curve, generally called 'I-V curve', comprising a set of operating points of the photovoltaic module. The I-V curve links a short-circuit operating point, at which the voltage is zero and the current is equal to the short-circuit current $I_{CC}$, and an open circuit operating point, at which the current is zero and the voltage is equal to the open circuit voltage $V_{OC}$. The electric power delivered by the photovoltaic module is the product of the voltage V across its terminals and the current I that it generates. It is at a maximum at a specific point of the curve, defined by a given current $I_{mpp}$ and a given voltage $V_{mpp}$. This maximum power point MPP is situated in an area of inflection of the current-voltage curve. The form of the I-V curve of a photovoltaic module depends on the irradiance received by the module, that is to say on the received light energy power. FIG. 3 shows a plurality of I-V curves, referenced C1 to C4, of one and the same photovoltaic module 1 subjected to various illuminance or irradiance levels:

curve C1 corresponds to an average illuminance level of 1102 W/m²;

curve C2 corresponds to an average illuminance level of 729 W/m²;

curve C3 corresponds to an average illuminance level of 307 W/m²;

curve C4 corresponds to an average illuminance level of 64 W/m².

The maximum power point $P1_{mpp}$, $P2_{mpp}$, $P3_{mpp}$ is shown on each of curves C1, C2 and C3. Curve C1 shows an operating point P1' that is shifted (to the left) with respect to the maximum power point $P1_{mpp}$. Generally, the photovoltaic installation is controlled such that the photovoltaic modules that it incorporates operate at their maximum power point. However, due for example to an illuminance level that is not homogeneous over the various photovoltaic modules of the installation, one or more modules may have a shifted operating point, such as the point P1'.

When an electric arc such as the electric arc 4 or 14 (FIG. 1) appears in the photovoltaic installation 100, the voltage across the terminals of each photovoltaic module 1 increases sharply by the arc voltage $V_{arc}$. The effect of this voltage jump, which is positive in this case, of magnitude $V_{arc}$ is that of moving the operating point of the photovoltaic module on the I-V curve to the right, as shown in FIG. 3, to a new operating point having a voltage equal to $V_0+V_{arc}$ (where $V_0$ represents the voltage of the photovoltaic module before the arc). The movement of the operating point of the photovoltaic module is accompanied by a jump that is negative in this case (or reduction or drop) of the operating current of the photovoltaic module 1, by a magnitude $dI_{arc}$. In contrast to the magnitude of the voltage jump, which is fixed and equal to $V_{arc}$, the magnitude $dI_{arc}$ of the current jump is variable. It varies depending on the position of the operating point on the I-V curve and depending on the level of illuminance of the photovoltaic module. For example, with reference to curve C1 of FIG. 3, if the operating point of the PV module 1 is a point P1' that is shifted to the left on the I-V curve with respect to the maximum power point $P1_{mpp}$, the current jump has a very small magnitude $dI_{arc}$. Moreover, the more the illuminance level decreases, the more the I-V curve flattens out and the more the magnitude $dI_{arc}$ of the current jump decreases, including for the maximum power point.

Figure 6:
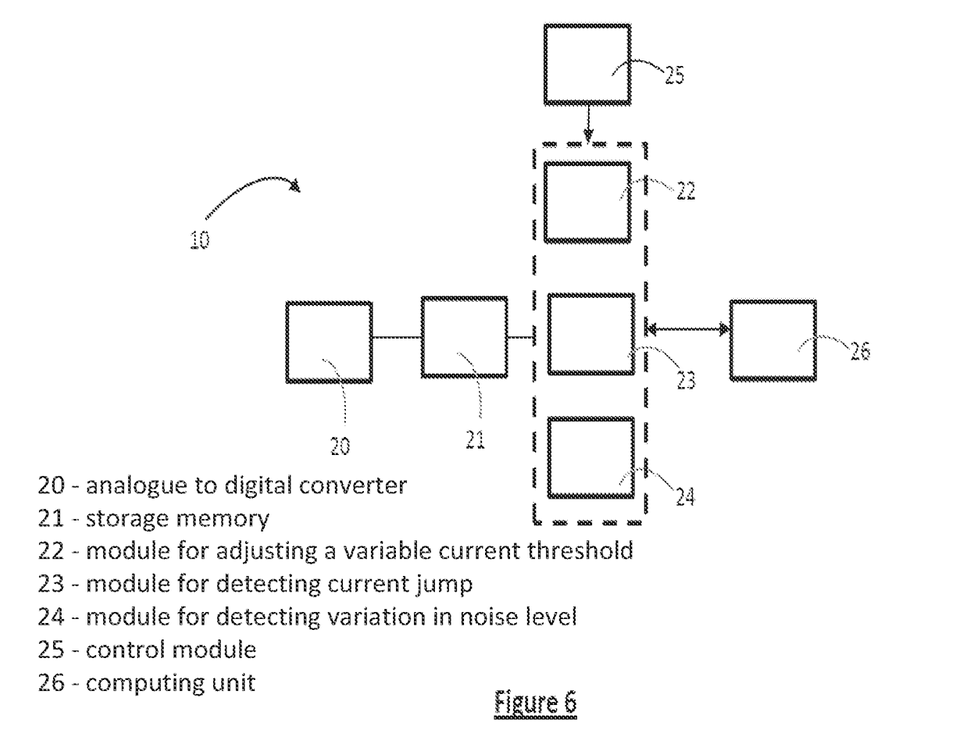
FIG. 6 shows a functional block diagram of a processing unit of the detection device, designed to implement processing steps of the method of FIG. 5.

FIG. 1 schematically shows an electric arc detection device 5 according to one particular form of implementation of the invention, for the photovoltaic installation 100. The detection device 5 comprises a measurement module 6 intended to measure the electric current I supplied by the photovoltaic installation 100, or an electrical value that is representative or the image of this electric current I. In this case, the measurement module 6 comprises a shunt resistor 7, positioned on an electrical link of the photovoltaic installation 100 (for example at the input of the inverter 2 as shown in FIG. 6), and a voltage measurement sensor 8 intended to measure the voltage across the terminals of the resistor 7. The current I supplied by the photovoltaic installation 100 is proportional to the voltage U across the terminals of the resistor 7, in accordance with the relationship:

$$I = \frac{1}{R} * U$$

(R representing the value of the resistor 7). The voltage U measured here is therefore the image of the DC current I delivered by the photovoltaic installation 100.

The measurement sensor 8 is linked, by a communication link 9, to a dedicated processing unit 10. The role of the processing unit 10 is to analyze the data and/or measurement signals transmitted by the measurement sensor 8 in order to detect the presence of a possible electric arc in the photovoltaic installation. In this case, it comprises an analog-to-digital converter 20 intended to digitize or sample the voltage signal measured by the sensor 8 in order to obtain measured and sampled voltage values that are representative of the current I of the photovoltaic installation. As a variant, the analog-to-digital converter could be incorporated into the measurement sensor 8. The role of the processing unit 10 is to detect an electric arc by analyzing the values measured by the sensor 8 that are representative of the electric current I supplied by the photovoltaic installation, by implementing the method for detecting an electric arc that will be described further on.

With reference to FIG. 6, the processing unit 10 comprises the following hardware and/or software components:

the analog-to-digital converter 20;

storage memories 21 intended to store measured and sampled values and calculated data;

a module 22 for adjusting a variable current threshold, as a function of measured values that are representative of the current I of the photovoltaic installation 100;

a module 23 for detecting a current jump having a magnitude greater than a current jump threshold adjusted as a function of values measured before the jump;

a module 24 for detecting a variation in the noise level of a signal formed by the measured values;

a control module 25 intended to control the respective operation of the modules 21, 22 and 23 and to determine the presence, or lack thereof, of an electric arc in the installation 100 as a function of results supplied by the adjustment module 22 and/or by the detection module 23;

a computing unit 26, in this case a microcontroller, intended to implement processing operations and calculations of data and to control the operation of the processing unit 10.

The modules 22 to 25 are in this case software components that are intended to be executed by the microcontroller 26.

The hardware and/or software components of the processing unit 10 are designed to implement the method that is described further on.

The processing unit 10 is linked to an intervention device 12 by a communication link 11. The role of the intervention device 12 is to interrupt an electric arc detected by the processing unit 10, upon the order of the latter, in order to prevent any risk of damage or of fire.

The electric arc detection device 5 and the intervention device 12 form a safety system for the photovoltaic installation.

Figure 5:
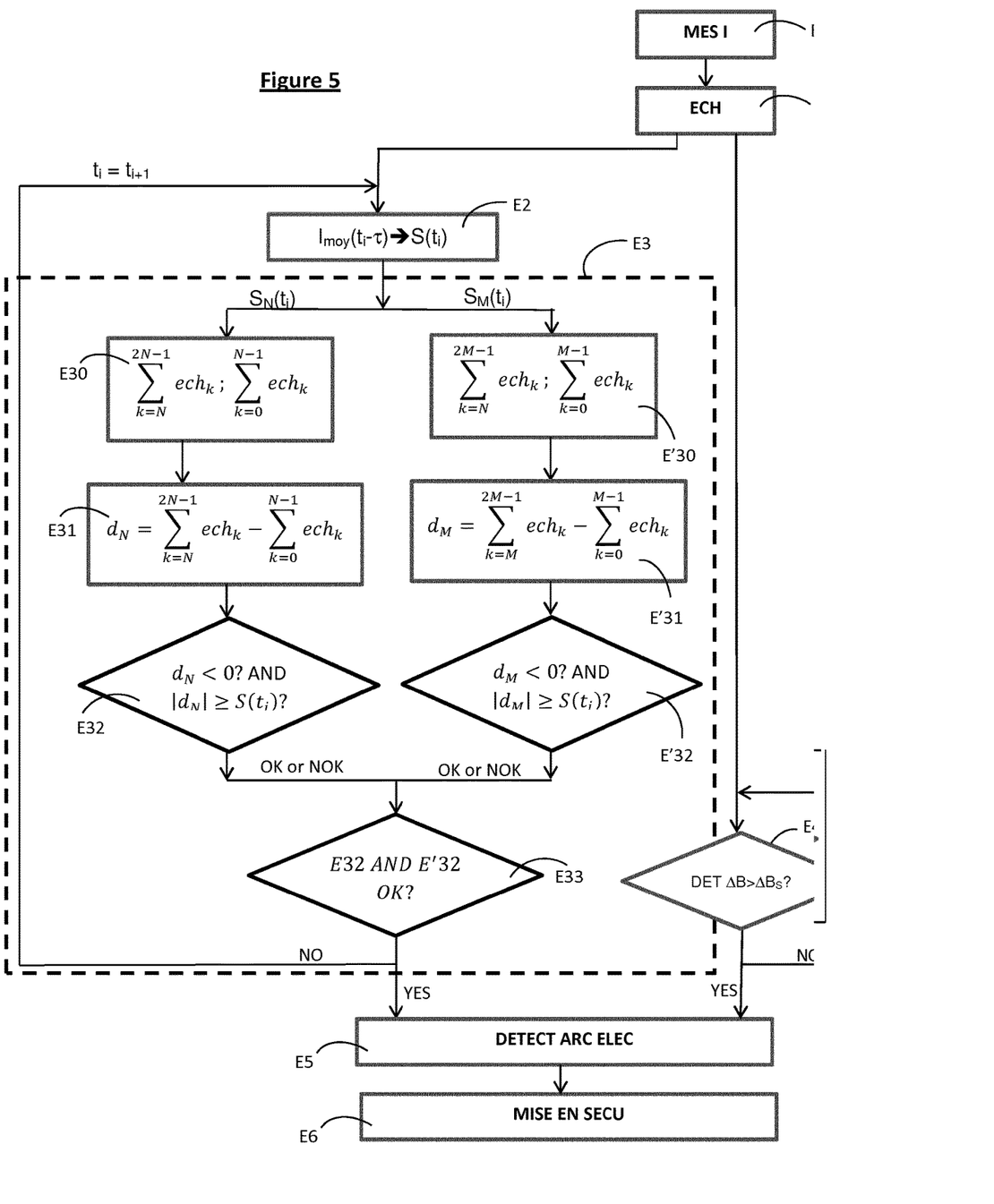
FIG. 5 shows a flow chart of the method for detecting an electric arc in a photovoltaic installation according to one particular embodiment of the invention.

One particular embodiment of the method for detecting an electric arc in the photovoltaic installation 100 intended to deliver an electric current I will now be described with reference to FIG. 5.

The method comprises a step E0 of measuring voltage values across the terminals of the resistor 7. The measured voltage values are proportional to and therefore representative, or images, of the electric current I delivered by the photovoltaic installation 100. Ultimately, the measurement that is performed amounts to measuring the current I delivered by the photovoltaic installation 100, to within a multiplication factor. As a variant, the resistor 7 and the voltage measurement sensor 8 could be replaced with a current measurement sensor. The measured signal, representative of the current I, is transmitted to the processing unit 10.

The measurement step E0 is followed by a sampling step E1 in which the measured signal is sampled at a chosen sampling frequency $F_{ech}$. Said frequency may be between 50 kHz and 1000 kHz. The measured values that are representative of the current I of the photovoltaic installation 100 are thus digitized by sampling into data representative of the current I, which will be called 'current data' hereinafter. The sampling is executed in this case by the A2D converter 20 of the processing device 10. As a variant, in the case of a measurement sensor incorporating an analog-to-digital converter, the sampling could be carried out by the sensor itself. The digitized current data are recorded in memories 21. For example, three buffer memories or 'buffers' are used, each having storage capacity for 256 points or samples.

Figure 4A:
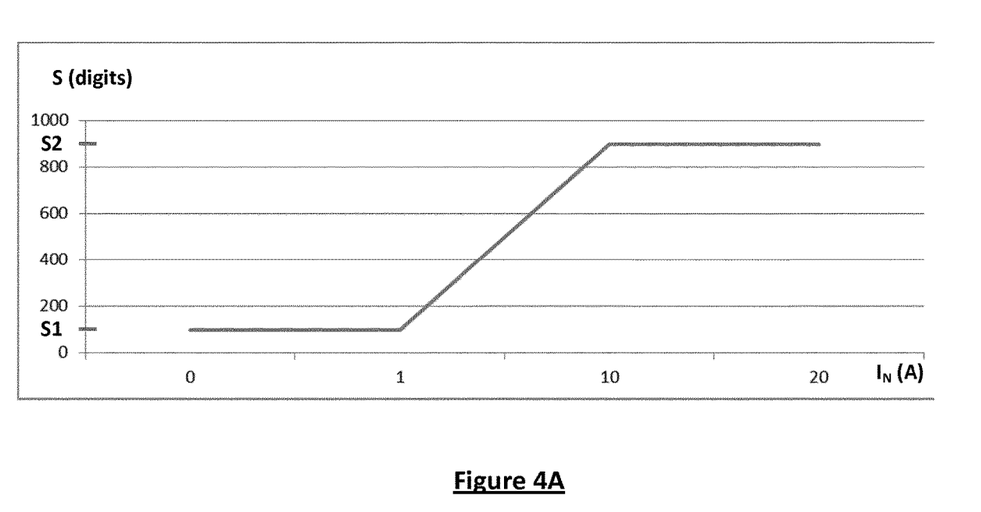
FIGS. 4A and 4B show laws or characteristics of variation of a current jump threshold as a function of a nominal current of the photovoltaic installation.

The method then comprises a step E2 of adjusting a current jump threshold S. The detection of an electric arc according to the invention is based on the detection of a current jump, as shown in FIG. 1, having a magnitude greater than a given current jump threshold S. This current jump threshold S is variable and has to be adjusted over time as a function of the measured values that are representative of the current I of the photovoltaic installation 100. The threshold S is adjusted in accordance with a law of variation of the current jump threshold as a function of the nominal current $I_n$ of the installation 100, as shown by way of illustrative example in FIG. 4A. 'Nominal' current $I_n$ is understood to denote the current delivered by the photovoltaic installation 100 under normal operating conditions (in particular without an electric arc), each photovoltaic module 1 of the installation 100 operating at an operating point of its I-V curve. With reference to FIG. 4A, the law of variation of the threshold S in this case includes:

- a first constant current jump threshold phase S1 for nominal current values $I_n$ of the photovoltaic installation 100 that are less than a lower limit of between 0 A and 8 A, advantageously between 0.8 A and 1.2 A, for example equal to 1 A;
- a second constant current jump threshold phase S2 for nominal current values $I_n$ of the photovoltaic installation that are greater than an upper limit, in this case equal to 10 A (by way of illustrative example);
- an intermediate phase of increased variation, or increasing, of the current jump threshold as a function of the nominal current $I_n$, the increase being linear in this case, for currents between the lower limit (in this case 1 A) and the upper limit (in this case 10 A).

Thus, in accordance with the law of variation as shown in FIG. 4A, the current jump threshold S is equal to a first value S1 when the nominal current $I_n$ of the photovoltaic installation 100 is less than or equal to the lower limit (in this case 1 A), and then increases linearly until it reaches a second value S2 when the nominal current $I_n$ of the photovoltaic installation 100 is equal to the upper limit (in this case 10 A), and lastly stagnates at this value S2 when the nominal current $I_n$ of the photovoltaic installation 100 is greater than the upper limit (in this case 10 A). In FIG. 4A, the threshold values are expressed in digits. Digitizing the value of the current gives tiered data that correspond to a number of digits. The digit therefore represents a current resolution. For example, if one digit represents 0.1 A, 100 digits represent 10 A. In the particular exemplary embodiment described here, 1 A corresponds to 113 digits. Generally, 1 A could correspond to a number of digits between 50 and 400, for example. It is possible to contemplate other forms of law of variation of the current jump threshold as a function of the nominal (or operating) current of the photovoltaic installation 100.

In step E2, in order to determine the adjusted threshold S that is valid at a given instant $t_i$, denoted $S(t_i)$, the processing module 10 calculates an average value of the current I over an analysis window containing a series of X measured and sampled values, in other words a series of X samples, covering a temporal period slightly before the instant $t_i$ and centered on an instant $(t_i-\tau)$ where $\tau$ represents a temporal shift. However, the analysis window should not be excessively far from the instant $t_i$, and should contain a sufficient and reasonable number of samples to take account of possible variations and acquire the information sufficiently quickly. The duration of the window is between 10 μs and 500 ms, for example. It covers a period preceding the jump. The temporal shift ($\tau$) must be at least one buffer (i.e. 256 samples) and advantageously less than 100 buffers. '$FA(t_i-\tau)$' denotes this analysis window and '$I_{moy}(t_i-\tau)$' denotes the average value of the current I calculated over this analysis window. Thus, the threshold $S(t_i)$ that should be applied at the instant $t_i$ is calculated on the basis of an analysis window $FA(t_i-\tau)$ that is shifted slightly in time before this instant $t_i$ and centered on an instant $(t_i-\tau)$. This slight temporal shift is tailored such that, in the event of a current jump in the current I at the instant $t_i$, or substantially at the instant $t_i$, the average current value $I_{moy}(t_i-\tau)$ used to determine the applicable threshold $S(t_i)$ corresponds to the average current supplied by the photovoltaic installation 100 just before the jump. The threshold S is thus updated, or adjusted, at each instant $t_i$ by a succession of instant $t_i$, where i=1, 2, etc. The threshold $S(t_i)$ is calculated using the predefined law of variation, as shown in FIG. 4A, for a 'nominal' current equal to the given average current value $I_{moy}(t_i-\tau)$.

The method then comprises a step E3 of detecting a current jump. This step is implemented at each instant $t_i$ on the basis of previously recorded current data. It aims to detect a current drop of a magnitude greater than the current jump threshold that is adjusted and valid at this instant $t_i$. The detection of a current jump uses a detection algorithm, as described hereinafter.

The jump detection algorithm uses a set of 2N successive recorded samples, in other words 2N sampled values that are representative of the current I. The number 'N' constitutes a detection (or analysis or processing) depth. $ech_k$ denotes the sample of index k. The algorithm involves implementing the following steps:

- calculating the sum of the N most recent samples $ech_k$ of index k ranging between 0 and N−1, and the sum of the N oldest samples $ech_k$ of index k ranging between N and 2N−1 (the N 'most recent' samples $ech_k$ having been measured after the N 'oldest' samples), in a first calculating step E30;
- then calculating the difference $d_N$ between the sum of the N oldest samples of index k ranging between N and 2N−1 and the sum of the N most recent samples of index k ranging between 0 and N−1, i.e. $d_N = \Sigma_{k=N}^{2N-1} ech_k - \Sigma_{k=0}^{N-1} ech_k$, in a second calculating step E31;
- checking whether the calculated difference $d_N$ is greater, in absolute value, than the threshold $S(t_i)$ determined for the instant $t_i$ (through comparison with this threshold) in a test step E32.

Figure 4B:
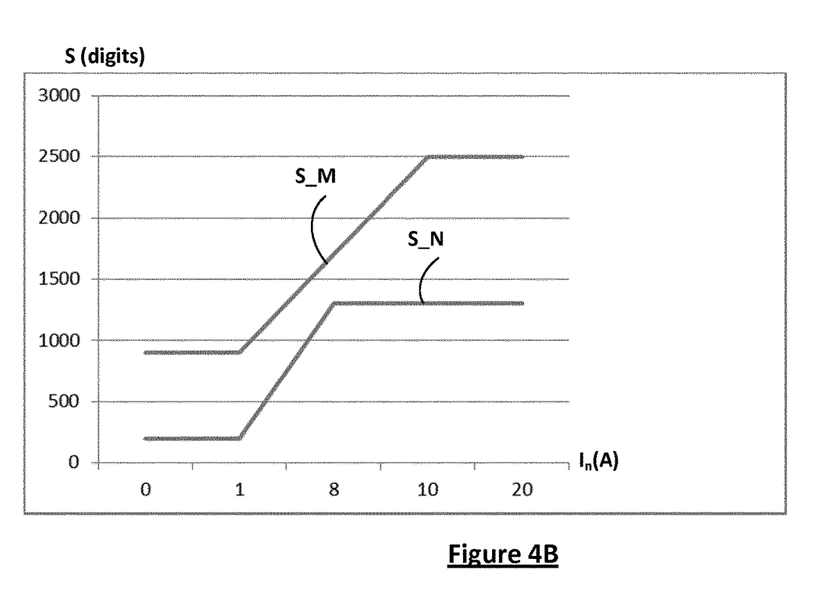

In the embodiment described here, the jump detection algorithm is executed for a first detection depth N, by implementing steps E30 to E32, and for a second detection depth M, by implementing steps E'30 to E'32, which are analogous to steps E30 to E32 but with a change of depth. The depth M is strictly greater than the depth N. In the exemplary embodiment described here, N is equal to 8 and M is equal to 128. FIG. 4B shows two threshold curves S_N and S_M corresponding to the laws of variation of the threshold expressed in digits as a function of the nominal current $I_n$ of the photovoltaic installation 100 and that are respectively applicable to the depth N and to the depth M. Two equivalent thresholds $S_N(t_i)$ and $S_M(t_i)$, expressed in digits and applicable to the depths N and M, respectively, correspond to a threshold $S(t_i)$ expressed in amperes.

Executing the jump detection algorithm for two different detection depths N and M makes it possible to filter out low-frequency dynamic variations (for the depth N) and high-frequency dynamic variations (for the depth M) in the current of the photovoltaic installation 100. These dynamic variations in the current I are caused by events other than electric arcs. For example, this may involve a reduction in the current produced by the installation 100 due to a cloud that causes the received illuminance to decrease or to current variations linked to stray pulse phenomena. The depth N is tailored so as to filter out dynamic variations in the current I of the photovoltaic installation 100, which variations are characterized by a characteristic frequency belonging to a frequency band between 1 Hz and 1000 Hz. The depth M is tailored so as to filter out dynamic variations in the current I of the photovoltaic installation 100, which variations are characterized by a characteristic frequency belonging to a frequency band between 100 kHz and 1000 kHz. More generally, the values of N and M may be chosen to be within a wide range, between 3 and 1500, in order to obtain satisfactory results from a sampling frequency between 50 kHz and 10 MHz.

In a test step E33, it is determined whether the two comparison steps E32 and E'32 give positive results, in other words whether the differences $d_N$ and $d_M$ calculated for the two depths N and M are greater than the respective thresholds. If the test E33 is positive, with the differences $d_N$ and $d_M$ calculated for the two depths N and M both being greater than the respective thresholds, the presence of an electric arc in the photovoltaic installation 100 is detected in a step E5. Thus, an electric arc is detected only if the differences calculated for the two depths N and M are greater than the corresponding thresholds. If the test is negative, the previous steps are reiterated at a later instant $t_{i+1}$.

The method also comprises the execution of an algorithm for detecting a variation ΔB in the noise level of the signal measured by the measurement sensor 8 in a step E4, which makes it possible to detect an increase in the noise level greater than a threshold or critical variation $ΔB_S$. An electric arc is accompanied by an increase in the noise level of the current signal I of the photovoltaic installation 100, due to the noise generated by the plasma of the electric arc. The algorithm for detecting a variation in the noise level aims to detect this increase in the noise level on the basis of the measured values that are representative of the current I of the photovoltaic installation 100, which values are sampled and recorded in buffer memories. To this end, it is possible to use any known method for processing the signal that makes it possible to detect the variation in the noise level of a signal.

For example, the algorithm for detecting a variation in the noise level may be based on the calculation of the variance of sampled measured values over a window of samples that slides over time, and on the detection of this variance exceeding a critical threshold.

If a variation in the noise level AB that is greater than the critical or threshold variation $ΔB_S$ is detected in step E4, an electric arc is detected in the photovoltaic installation, and the method moves to step E5.

If a variation in the noise level AB that is greater than the critical or threshold variation $ΔB_S$ is not detected in step E4, the method reiterates step E5 for a time-shifted analysis window.

The algorithm for detecting a variation in the noise level may be executed several times on the same samples while modifying certain parameters of the algorithm, so as to detect various types of specific electric arcs or to exclude a false electric arc detection caused by a particular event (for example at startup of the photovoltaic installation at nominal current at the maximum power point).

The algorithm for detecting a variation in the noise level makes it possible to supplement the detection, carried out by the detection algorithm, of a current jump. In particular, in cases where the electric arc does not cause a current jump having a magnitude that is sufficient to be detected (for example on account of a low level of illuminance of the photovoltaic installation or on account of an operating point that is shifted to the left on the I-V curve with respect to the maximum power point), the algorithm for detecting a variation in the noise level nevertheless makes it possible to detect a possible electric arc.

The algorithm for detecting a current jump and the algorithm for detecting a variation in the noise level of a current jump may be executed in parallel. The presence of an electric arc is detected if at least one of the two steps E3 and E4 produces a positive electric arc detection result.

When an electric arc is detected (step E5), the processing unit 10 transmits an order to protect the photovoltaic installation 100, in a step E6, to the intervention device 12. This protection may be based on remotely controlled switches. It may be formed of an order to interrupt the operation of the photovoltaic installation, thereby making it possible to stop the electric arc by thus eliminating any risk of damage and/or of fire.

Figure 2A:
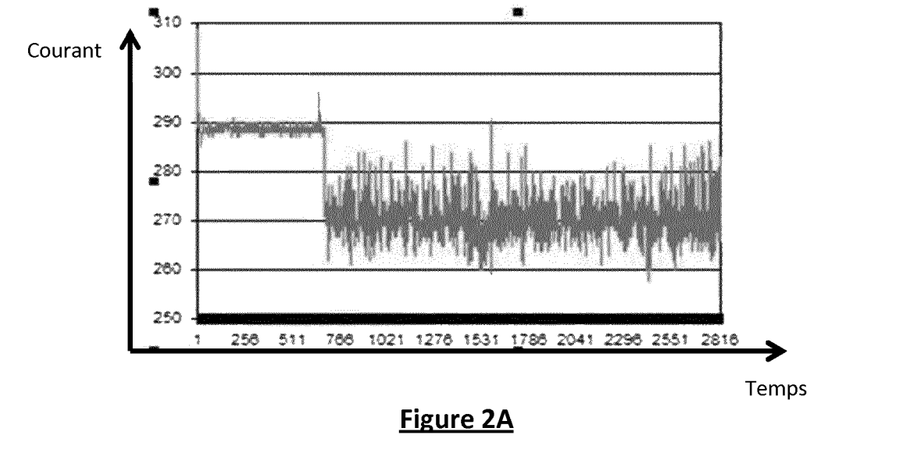
FIGS. 2A and 2B show two examples of current signals delivered by a photovoltaic installation and each including a current jump caused by an electric arc.
Figure 2B:
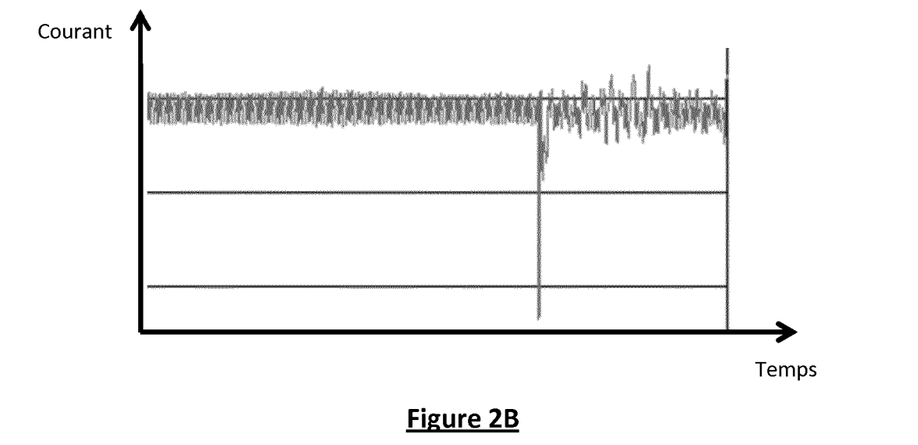

By way of illustrative example, FIGS. 2A and 2B show current signals measured when an arc is present. In FIG. 2A, the electric arc causes a negative current jump that will be detected by step E3 of detecting a current jump, if the detection method described above is implemented. In FIG. 2B, the current returns to its initial value very quickly after the current jump, with an increase in the noise level. In this case, the electric arc will be detected by step E4 of detecting a variation in the noise level, if the detection method described above is implemented.

The invention claimed is:

1. A method for detecting an electric arc in a photovoltaic installation intended to deliver an electric current, the method comprising:
   measuring values that are representative of the electric current delivered by the photovoltaic installation;
   adjusting a variable current jump threshold as a function of measured values;
   detecting a current jump having a magnitude greater than the variable current jump threshold adjusted as a function of values measured before the jump;
   detecting an electric arc upon detection of the current jump, wherein the adjusting of the variable current jump threshold uses a law of variation of the threshold as a function of a nominal current of the photovoltaic installation, including a phase of increasing the variable current jump threshold as a function of the nominal current, and wherein the law of variation of the threshold includes a constant current jump threshold phase for nominal current values of the photovoltaic installation that are less than a lower limit of between 0 A and 8 A.

2. The method as claimed in claim 1, wherein the phase of increasing the variable current jump threshold is linear.

3. The method as claimed in claim 1, wherein the law of variation of the threshold includes a constant current jump threshold phase for values of current delivered by the photovoltaic installation that are greater than an upper limit.

4. The method as claimed in claim 1, wherein, to detect the current jump, the current jump threshold is adjusted as a function of an average current calculated over a temporal window of a duration between 50 µs and 500 ms preceding the current jump.

5. The method as claimed in claim 1, comprising detecting a variation in the noise level of a signal of the measured values that is greater than a critical variation.

6. The method as claimed in claim 5, wherein the detecting of a variation in the noise level is executed several times on the same samples while modifying parameters so as to detect various types of specific electric arcs.

7. The method as claimed in claim 5, wherein, with the measured values being sampled, in the detecting of a variation in the noise level, the variance of sampled measured values is calculated.

8. The method as claimed in claim 7, wherein, in the detecting of a variation in the noise level, the variance of sampled measured values is calculated over a window of samples that slides over time.

9. A method for detecting an electric arc in a photovoltaic installation intended to deliver an electric current, the method comprising:
   measuring values that are representative of the electric current delivered by the photovoltaic installation;
   adjusting a variable current jump threshold as a function of measured values;
   detecting a current jump having a magnitude greater than the variable current jump threshold adjusted as a function of values measured before the jump;
   detecting an electric arc upon detection of the current jump,
   wherein, with the measured values that are representative of the current delivered by the photovoltaic installation being sampled, to detect a current jump, a set of 2N successive samples is recorded, N constituting a given detection depth, and a jump detection algorithm is executed, consisting in calculating the difference between the sum of the N oldest samples and the sum of the N most recent samples, and in checking whether the calculated difference is greater, in absolute value, than an adjusted current jump threshold.

10. The method as claimed in claim 9, wherein the jump detection algorithm is executed for two different detection depths N and M, and an electric arc is detected only if it is determined that the differences calculated for the two depths are greater, in absolute value, than the corresponding thresholds.

11. The method as claimed in claim 10, wherein the size N is tailored so as to filter out dynamic variations in the current of the photovoltaic installation, which variations are characterized by a characteristic frequency belonging to a frequency band between 1 Hz and 1000 Hz.

12. The method as claimed in claim 9, wherein the size M is tailored so as to filter out dynamic variations in the current of the photovoltaic installation, wherein the variations are characterized by a characteristic frequency belonging to a frequency band of from 100 kHz to 1000 kHz.

13. A device for detecting an electric arc in a photovoltaic installation intended to deliver an electric current, the device comprising:
   a module for measuring values that are representative of the electric current delivered by the photovoltaic installation;
   a module for adjusting a variable current jump threshold as a function of measured values;
   a module for detecting a current jump having a magnitude greater than the variable current jump threshold adjusted as a function of values measured before the jump,
   wherein the device is configured such that the adjusting of the variable current jump threshold uses a law of variation of the threshold as a function of a nominal current of the photovoltaic installation, including a phase of increasing the variable current jump threshold as a function of the nominal current, and such that the law of variation of the threshold includes a constant current jump threshold phase for nominal current values of the photovoltaic installation that are less than a lower limit of between 0 A and 8 A.

14. The device as claimed in claim 13, comprising a module for detecting a variation in the noise level of a signal formed by the measured values that is greater than a critical variation.

15. A photovoltaic installation, comprising a device for detecting an electric arc as claimed in claim 13.

16. A safety system for a photovoltaic installation, comprising a device for detecting an electric arc as claimed in claim 13 and an intervention device intended to protect the photovoltaic installation in the event of an electric arc.

17. A photovoltaic installation, comprising a safety system as claimed in claim 16.

18. A device for detecting an electric arc in a photovoltaic installation intended to deliver an electric current, the device comprising:
   a module for measuring values that are representative of the electric current delivered by the photovoltaic installation;
   a module for adjusting a variable current jump threshold as a function of measured values;
   a module for detecting a current jump having a magnitude greater than the variable current jump threshold adjusted as a function of values measured before the jump, further including an analog-to-digital converter intended to sample the measured values that are representative of the current delivered by the photovoltaic installation, and means for storing sampled measured values intended to store a set of 2N successive samples, N constituting a given detection depth, wherein the module for detecting a current jump is designed to execute a jump detection algorithm, consisting in calculating the difference between the sum of the N oldest samples and the sum of the N most recent samples, and in checking whether the calculated difference is greater, in absolute value, than an adjusted current jump threshold.

* * * * *